United States Patent [19]

Khan

[11] Patent Number: 4,857,776

[45] Date of Patent: Aug. 15, 1989

[54] TRUE TTL OUTPUT TRANSLATOR-DRIVER WITH TRUE ECL TRI-STATE CONTROL

[75] Inventor: Aurangzeb K. Khan, San Bruno, Calif.

[73] Assignee: Tandem Computers Incorporated, Cupertino, Calif.

[21] Appl. No.: 123,093

[22] Filed: Nov. 20, 1987

[51] Int. Cl.[4] .................. H03K 19/092; H03K 19/00; H03K 5/22; H03K 19/086

[52] U.S. Cl. .................................. 307/475; 307/473; 307/455; 307/355; 307/443

[58] Field of Search .............. 307/473, 475, 443, 455, 307/456, 457, 458, 466, 467, 355

[56] References Cited

U.S. PATENT DOCUMENTS

| | | | |
|---|---|---|---|
| 4,518,876 | 5/1985 | Constantinescu | 307/475 |
| 4,644,194 | 2/1987 | Birrittella et al. | 307/455 |
| 4,677,320 | 6/1987 | Hannington | 307/473 |
| 4,678,944 | 7/1987 | Williams | 307/475 |

Primary Examiner—Stanley D. Miller
Assistant Examiner—Trong Quang Phan
Attorney, Agent, or Firm—Townsend and Townsend

[57] ABSTRACT

The present invention provdes a circuit for driving a TTL bus from an ECL circuit. The circuit of the present invention speeds up the "tri-state" to "active" transition by eliminating the need to pass the tri-state signal through a translator and buffer. A tri-state control circuit accepts true ECL input directly, thus eliminating the delay, power and density "cost" of the translator and buffer circuits. This circuit further improves the delay performance of tri-state/active transitions by restricting device saturation to low levels.

5 Claims, 2 Drawing Sheets

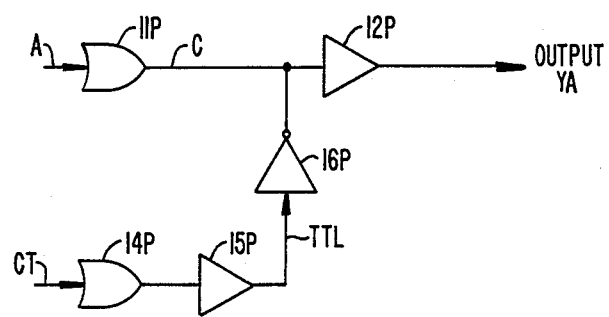
FIG._1.
(PRIOR ART)

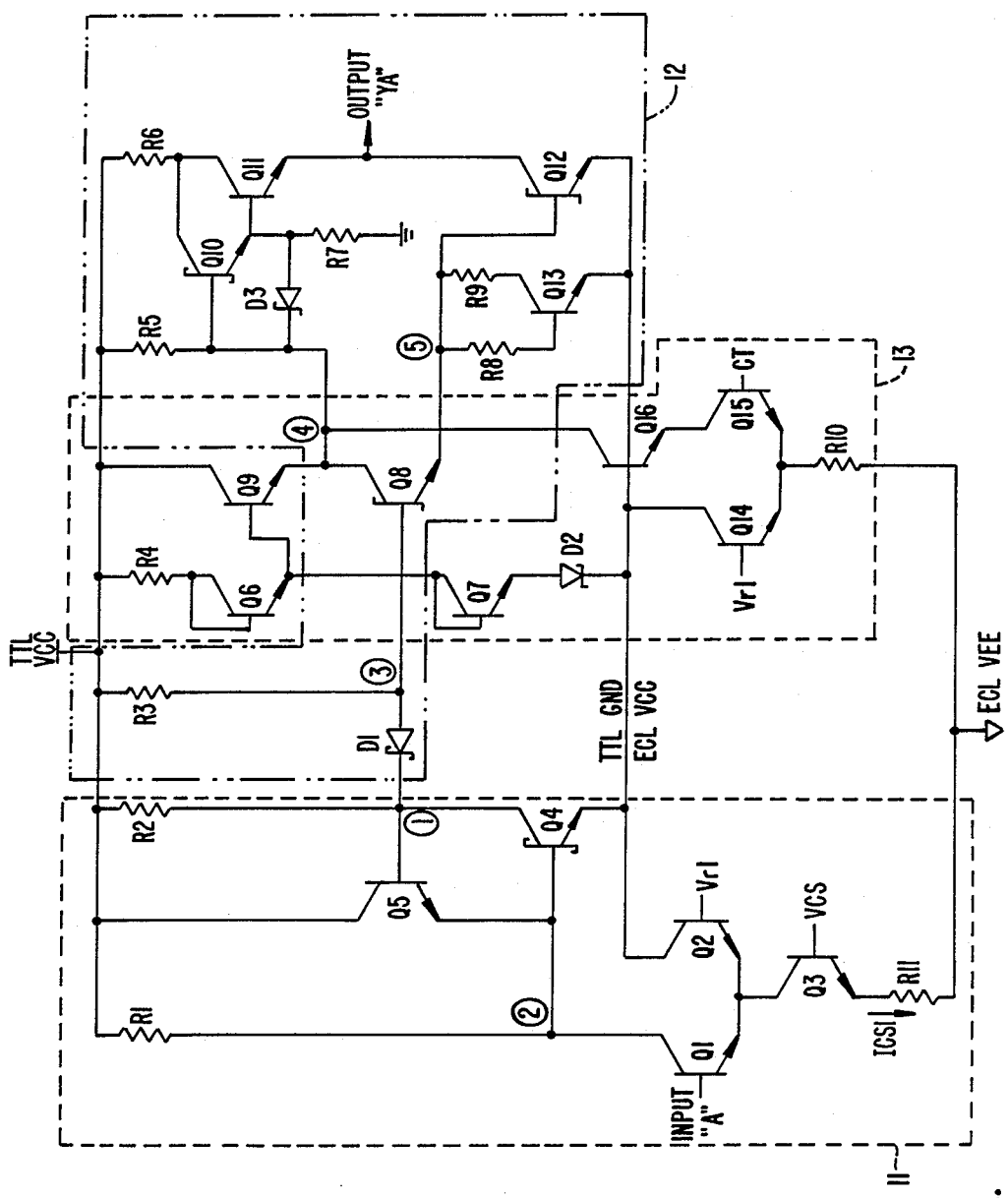
FIG._2.

TRUE TTL OUTPUT TRANSLATOR-DRIVER WITH TRUE ECL TRI-STATE CONTROL

TECHNICAL FIELD

The present invention relates to integrated circuits and more particularly to circuits for translating from Emitter coupled Logic (ECL) to Transistor-Transistor Logic (TTL).

BACKGROUND AND PRIOR ART

In digital systems, bidirectional busses are often used to transmit data and control signals back and forth across various sub-systems.

In order to reduce the number of physical busses required to realize a desired level of functionality, such busses are often shared by time multiplexing. It is known that a time multiplexed bus, with two sets of drivers/receivers, can achieve functional equivalence to two separate busses, provided that both sets of drivers are not simultaneously active.

If two separate bus drivers are active concurrently, and especially if each set of drivers attempts to force the bus voltage levels to different digital values, bus contention results. In such a situation, the voltage level on the bus can attain forbidden, non-specified, or indeterminate values. Typically, the propagation delay also increases significantly in such a situation.

In conventional TTL bus design, a "Tri-State" or "High Impedance" driver design methodology allows multiple drivers to share a common bus. A "normal" TTL driver sources current when it is at a high level and sinks current when it is at a low level. By contrast, a "tri-stated" TTL driver neither sources nor sinks current in both high and low levels. In electronic terms, a tri-stated driver behaves like a high impedance node.

A TTL tri-state bus generally has several sets of drivers/receivers connected to it. Each of the driver/receivers connected to a bus can be put in active drive or tri-state modes by asserting the proper input signal on an associated "Tri-State Control" circuit. Such a tri-state control function is a normal part of the TTL tri-statable driver.

Conventional bus design practice requires that, at any given time, only one set of drivers is active on the bus. Prior to enabling one set of drivers to the active drive mode, all other drivers must be tri-stated. This ensures that bus contention does not occur.

The speed with which drivers can be put into or taken out of tri-state mode directly affects the functional performance of the bus. The speed of the transition between "tri-state" and "active" modes determines the speed of the multiplexing operation. The delay involved in such transitions is a major limitation in the design of high speed systems using conventional TTL technology.

In conventional TTL tri-state control design, a TTL signal is used to drive the control circuitry. Also, the control circuit itself is based on conventional TTL design methods. The delay performance of such a control circuit is relatively poor.

In the conventional integrated circuit situation where a true ECL circuit is used to drive a true TTL tri-state bus, the approach is as follows: True ECL signals are those that are internal to the chip and are first translated to internal true TTL signals. These true TTL levels are buffered and then used a input to the tri-state control circuit, which either tri-states or activates the I/0 driver it controls. This technique "costs" two output cells worth of power and density. It is also quite slow since the ECL tri-state signal is first translated into a TTL signal via a conventional translator circuit, then buffered, and finally input to the control circuit. The series delay of the translator and buffer circuits added to the tri-state input makes the "tri-state" to "active" mode transitions quite slow. This poor delay performance makes the use of tri-state drivers impractical in fast TTL digital designs.

OBJECTS OF THE INVENTION

An object of the present invention is to provide an improved Bus Translator-Driver Circuit.

Another object of the invention is to provide a circuit for driving a TTL bus from ECL logic.

A further object of the present invention is to provide a fast circuit for driving a TTL bus from an ECL circuit.

A still further object of the invention is to provide a circuit for driving a TTL bus from an ECL circuit which can quickly switch the bus to a high impedance mode.

Yet another object of the invention is to provide a circuit which can drive a TTL bus from an ECL circuit and which can switch the output to a high impedance mode without going through an ECL to TTL translator buffer stage.

SUMMARY OF THE INVENTION

The present invention provides a circuit for driving a TTL bus from an ECL circuit. The circuit of the present invention dramatically speeds up the "tri-state" to "active" transition by eliminating the need for a translator and buffer. The tri-state control circuit of the present invention accepts true ECL input directly, thus eliminating the delay, power and density "cost" of the translator and buffer circuits. This circuit further improves the delay performance of tri-state/active transitions by restricting device saturation to low levels.

DESCRIPTION OF THE DRAWINGS

FIG. 1 is a diagram showing the prior art.

FIG. 2 is a circuit diagram of a preferred embodiment of the present invention.

DETAILED DESCRIPTION

The terms "true TTL" and "true ECL" are used herein in the conventional sense. The terms "true TTL" and "true ECL" positively distinguish from the terms "pseudo TTL" and "pseudo ECL". In general, true TTL voltages are in the range of zero to plus five volts, and true ECL voltages are negative in the range of zero to minus two volts. Pseudo TTL voltages have a five volt difference between the high and low states, but the voltages are negative, that is, pseudo TTL signals are from zero to minus five volts. Pseudo ECL signals have about a two volt range, but they are positive, that is, they range from zero to plus two volts.

ECL and TTL are two well-known and commonly used types of circuitry. ECL signals have a "high" level of −800 millivolts and a "low" level of −1560 millivolts. TTL signals have "high" values that range from 2 volts to 5 volts and have "low" values that range from 0 volts to 800 millivolts. See copending application Ser. No. 123,507 filed Nov. 20, 1987 for diagrams showing these voltage levels.

The circuits shown in FIGS. 1 and 2 accept a true ECL level input signal designated "A" and translates it to a true TTL level output designated "YA". The output signal "YA" can be used to drive a bus (not specifically shown herein). In addition to the "high" and "low" states, the outputs of the circuits shown in FIGS. 1 and 2 also have a "high impedance" state. The high impedance state is turned enabled or disabled by a true ECL level signal designated "CT".

The diagrams shown in FIGS. 1 and 2 have conventional solid lines to indicate circuit connections. FIGS. 1 and 2 also have light dotted lines around several parts of the figures. These light dotted lines do not represent circuit connections. The light dotted lines merely divide the circuit into several parts to facilitate explaining how the circuit operates.

A typical prior art true ECL to true TTL translator driver circuit is shown in FIG. 1. As shown in FIG. 1, the translator driver circuit includes an inverter circuit 11P that receives a true ECL input "A" and which produces a true TTL output signal "C". The signal "C" in turn provides an input to a TTL inverter/driver 12P. An ECL signal designated "CT" indicates whether or not the driver should be connected to the bus, that is, whether or not the driver should be in the high impedance or in the normal high/low state. The signal "CT" goes through a true ECL to a true TTL translator 14P, and a TTL buffer driver 15P goes to a tri-state control circuit 16P. Thus, in this prior art circuit, the enable signal "CT" is translated from a true ECL signal to a true TTL signal before it is applied to the tri-state control circuit 16P. This translation of the signal "CT" requires time and it is the limiting factor in how fast the circuit can switch from the enable to the disenable state and back again. Slowing down the transition from enable to disenable reduces the number of times that a bus can be used to transmit signals from different drivers.

A circuit built in accordance with the present invention is shown in FIG. 2. As shown by the dotted lines in FIG. 2, for ease of explanation, the circuit can be divided into three functional units. First, there is a conventional true ECL to a true TTL translator 11. Second, the circuit has a conventional TTL inverter driver circuit 12. The third part of the circuit is a novel circuit 13 which enables/disables the tri-state or high impedance mode.

The circuit consists of sixteen transistors Q1 to Q16, eleven resistors R1 to R11, and three Schottky diodes D1 to D3. Transistors Q4, Q8, Q10, Q12 and Q13 have a Schottky diode in parallel with their base-collector junction. The input of the circuit is designated "A" and the output is designated "YA". The true ECL level control signal which switches the circuit to the high impedance mode is designated "CT". The key feature of the circuit is that the true ECL signal "CT" switches the circuit to a "high impedance mode," that is, output transistors Q11 and Q12 are both turned off without first translating signal "CT" into a TTL signal.

The true ECL to true TTL translator 11 as shown herein is configured with the transistors Q1, Q2, and Q3 forming an inverter. Other functions such as OR, NOR, or AND functions could likewise be configured at this point in the circuit.

The following is a detailed description of how the circuit operates devices Q1, Q2, Q3 and R11 to perform a current-steered switching function. Vr1 is the ECL reference voltage. Further, let the voltage at the base of transistor Q1 switch to 0.5 Vbe about Vr1. Then, if Vb(Q1)>Vr1, then transistor Q1 develops a full Vbe, and goes into forward active conduction, while transistor Q2 attains <0.5Vbe, and is considered cut-off. Hence, current source Ics1 (Q3/R11) is satisfied by Q1. If Vb(Q1)<Vr1, then transistor Q2 develops a full Vbe, and goes into forward-active conduction, while transistor Q1 attains <0.5Vbe, and is considered cut-off. Hence, current source Ics1 (Q3/R11) is satisfied by Q2. Note that Vbe is the nominal forward voltage of the bipolar transistor Q1 (and Q2). The Vbe voltage is set by device characteristics, as a function of device current. All devices in this circuit are designed to appropriate dimensions such that with the defined nominal emitter current, the transistors attain uniform Vbe voltages.

If Vb(Q1)>Vr1, then the Q1 emitter current, Ie(Q1), is set by, $$Ie(Q1) = [Hfe/(Hfe+1)] * \{[VCS - Vbe(Q3)]/R11\} \quad (i)$$

If Vb(Q1)<Vr1, then the Q2 emitter current, Ie(Q2), is set by, $$Ie(Q2) = [Hfe/(Hfe+1)] * \{[VCS - Vbe(Q3)]/R11\} \quad (ii)$$

Let Vb(Q1)<Vr1. Then, Ics1 is satisfied by ECL VCC through Q2. In this case, resistor R1 sources current I(R1), $$I(R1) = [TTL\ VCC - Vbe(Q4)]R1 \quad (iii)$$

through TTL VCC, to the base of transistor Q4. This excess base drive forces transistor Q4 to transition from the forward-active mode to the saturation mode. Consequently, the Schottky diode, in parallel with the base-collector function of transistor Q4, clamps node 1 to a voltage greater than TTL GND by VCEsat. We define VCEsat to be 0.25Vbe. In this way, the V(1)LOW voltage level is established.

Let Vb(Q1)>Vr1. Then, Ics1 is satisfied by TTL VCC through Q1, R1, Q5 and R2 as follows, $$Ic(Q1) = \{[Hfe/(Hfe+1)]^{**}\ 2\} * Ics1 \quad (iv) \text{ and}$$

$$Ic(Q1) = I(R1) + Ie(Q5) \quad (v)$$

Resistor R1 is chosen to be a sufficiently high value to ensure that, $$Ic(Q1) * R1 > TTL\ VCC - TTL\ GND \quad (vi)$$

Consequently, R1 alone cannot source Ic(Q1) completely. When Ics1 is steered into the Q1 path, V(2) begins to move downward toward TTL GND. Transistor Q4 is no longer supplied an excess base current. It therefore returns to a forward-active mode from the saturated mode. Note that transistors Q4 and Q5 are configured to provide a strong stabilizing feedback such that node 1 attains a voltage V(1)=2Vbe. In this way, the V(1)HIGH voltage level is established.

TTL Inverter / Output Driver: Devices D1, D3, Q8, Q10, Q11, Q12, Q13, R3, R5, R6, R7, R8 and R9 are used to perform the TTL inverter/driver function. This is accomplished as follows.

Let V(1) = V(1)LOW = VCEsat. Then, Vsd(D1) is established by the flow of current I(R3), which is given by, $$TTL\ VCC - [I(R3) * R3] - Vsd(D1) - VCEsat(Q4)$$
$$= 0 \quad (vii)$$

$$I(R3) = [TTL\ VCC - Vsd - VCEsat]/R3 \quad \text{(viii)}$$

Note that Vsd(D1) is a slow function of I(R3) at or near the nominal Vsd / Id operating point. I(R3) is designed such that transistor Q8 can be provided sufficient base current overdrive in one mode, and Schottky diode D1 develops a nominal Vsd in the other mode. Now, since I(R3) is conducted via diode D1 and transistor Q4 to TTL GND, $$Vb(Q8) = VCEsat + Vsd \quad \text{(ix)}$$

However, in order for Q12 to force a VCEsat voltage at the output YA, Vb(Q8) needs to be, $$Vb(Q8) = Vbe(Q8) + Vbe(Q12) >= \sim 2Vbe \quad \text{(x)}$$

Since $Vb(Q8) < \sim 2Vbe$, with reference to eqs. ix and x, we find that a full Vbe is not sustained across transistor Q12. Therefore, transistors Q8 and Q12 are in the cut-off mode and V(4) tends toward TTL VCC. As a result, the Darlington configured transistor pair, Q10 & Q11, acts as an emitter follower in driving the output YA. VOH(YA) is established as, $$VOH(YA) = TTL\ VCC - [I(R5) * R5] - Vbe(Q10) - Vbe(Q11) \quad \text{(xi)}$$

Let $V(1) = V(1)HIGH = \sim 2Vbe$. Then, Schottky diode D1 is in the zero-biased mode, and the flow of current I(R3) is given by, $$TTL\ VCC - [I(R3)*R3] - Vbe(Q8) - Vbe(Q12) 2\ 0 \quad \text{(xii)}$$

$$I(R3) = [TTL\ VCC - 2Vbe]/R3 \quad \text{(xiii)}$$

Note that Vbe is a slow function of Ie at or near the nominal Vbe / Ie operating point. I(R3) is designed such that transistor Q8 can be provided sufficient base current overdrive to force it into the saturated mode.

$$Vb(Q8) = Vbe(Q8) + Vbe(Q12) = \sim 2Vbe \quad \text{(xiv)}$$

which is exactly the value required at Vb(Q8) in order for Q12 to force a VCEsat voltage at the output YA. Since $Vb(Q8) = \sim 2Vbe$, with reference to eqs. x and xiv, we find that transistor Q8 saturates such that V(4) tends to, $$V(4) = VCEsat(Q8) + Vbe(Q12) \quad \text{(xv)}$$

In this case, the I(R3) and I(R5) currents are drawn from TTL VCC to TTL GND via transistors Q12 and Q13. I(R3) and I(R5) can be defined as, $$I(R3) = [TTL\ VCC - 2Vbe]/R3 \quad \text{(xvi)}$$

$$I(R5) = [TTL\ VCC - VCEsat - Vbe]/R3 \quad \text{(xvii)}$$

From eq. xv, we note that the Darlington configured transistor pair, Q10 & Q11, is cut-off for all output voltages such that, $$VO(YA) + Vbe(Q11) + Vbe(Q10) > VCEsat(Q8) + Vbe(Q12) \quad \text{(xviii)}$$

This inequality is satisfied for all legitimate TTL VOL values. Due to the combined I(R3) and I(R5) currents flowing through transistors Q12 and Q13, both devices operate in the saturated mode. Consequently, VOL(YA) is established as, $$VOL(YA) = VCEsat(Q12) \quad \text{(xix)}$$

Devices R8, R9, and Q13 improve the edge transition delay performance of the circuit. Briefly, during the V(5) transition from $\sim 0.5Vbe$ to Vbe, Q13 attains a nominal forward-active Vbe later than transistor Q12, thus reducing the time needed by Q12 to move VO(YA) from VOH to VOL. When V(5) transitions from Vbe to 0.5Vbe; R8, R9, and Q13 need to be designed such that Q13 exits the saturated mode after Q12 has transitioned from the saturated mode to cut-off mode.

In the analysis presented above, a single input—A—has been used to illustrate the inverter function. However, this circuit technique can also be extended to allow multiple input OR / NOR functions, as well as series-gated multiple input and functions.

True ECL Tri-State Enable / Disable Control: Devices D2, Q6, Q7, Q9, R4, Q14, Q15, Q16 and R10 perform the fast tri-state state control function. The current steering switch is designed to accept normal internal true ECL levels referenced against Vr1. CT is the tri-state control input signal which operates at the nominal internal true ECL voltage levels.

If $V(CT) < Vr1$, then the current I(R10) is provided by ECL VCC via transistor Q14. In this case, I(R10) is given by, $$I(R10) = [Vr1 - Vbe(Q14)]/R10 \quad \text{(xx)}$$

and the output is not tri-stated, but rather behaves as a True ECL to-TTTL inverter/translator driver.

If $V(CT) > Vr1$, then the current I(R10) is provided by ECL VCC via transistors Q16 and Q15 from node 4. In this case, I(R10) is, $$Ic(Q16) = [(Hfe/Hfe + 1)**2]* I(R10) \quad \text{(xxi)}$$

If the input A is at a low level, then $V(1) = VCEsat$ and $V(3) < 2Vbe$. Thus, transistor Q8 is in the cut-off mode and V(4) approaches TTL VCC. With this set-up, when CT is asserted, transistor Q16 turns on to source I(R10) via node 4. The current is initially sourced from resistor R5. However, the value of resistor R5 is chosen such that, $$Ic(Q16)*R5 > TTL\ VCC - ECL\ VCC \quad \text{(xxii)}$$

Note that TTL GND and ECL VCC are connected together for this circuit, which is the normal condition. As the voltage at node 4 moves from TTL VCC toward ECL VCC / TTL GND, transistor Q9 transitions from the cut-off to the forward-active mode and effectively clamps V(4) at, $$V(4) = Vsd(D2) + Vbe(Q7) - Vbe(Q9) \quad \text{(xxiii)}$$

$$V(4) = Vsd \quad \text{(xxiv)}$$

above TTL GND / ECL VCC. This V(4) voltage ensures that TTL output totem-pole top and bottom drivers are in the cut-off mode, thus ensuring that output YA is in the high impedance, tri-stated mode.

In this case, the Ic(Q16) current is sourced by Ie(Q9) and I(R5) as follows, $$Ic(Q16) = \{[TTL\ VCC - V(4)]/R5\} + Ie(Q9) \quad \text{(xxv)}$$

If the input A is at a high level, then $V(1)=\sim 2Vbe$, Schottky diode D1 is zero-biased, and $V(3)=\sim 2Vbe$. In this mode, current I(R3) flows to the base of transistor Q8 causing it to enter the saturated mode.

$$I(R3)=[TTL\ VCC-Vbe(Q8)-Vbe(Q12)]/R3 \quad \text{(xxvi)}$$

Thus, transistor Q8 effectively clamps V(4) at, $$V(4)=\sim Vbe + VCEsat \quad \text{(xxvii)}$$

Now, with input A at a high level, when CT is asserted, transistor Q16 turns on to source I(R10) via node 4.

$$Ic(Q16)=\{[Hfe/Hfe+1]^{**}2\}*I(R10) \quad \text{(xxviii)}$$

In this case, the Ic(Q16) current is sourced by I(R3), Ie(Q15), and I(R5) as follows, $$I(R3)=[TTL\ VCC-Vsd(D2)-Vsd(Q8)]/R3 \quad \text{(xxix)}$$

$$I(R5)=[TTL\ VCC-Vsd]/R5 \quad \text{(xxx)}$$

$$Ic(Q16)=I(R3)+Ie(Q9) \quad \text{(xxxi)}$$

I(R10) is chosen such that, $$[Ic(Q16)*R5]>[TTL\ VCC-TTL\ GND] \quad \text{(xxxii)}$$

Thus, when CT is asserted and I(R10) is sourced from node 4, V(4) begins to move toward TTL GND / ECL VCC until transistor Q9 effectively clamps V(4) at, $$V(4)=Vsd \quad \text{(xxxiii)}$$

above TTL GND / ECL VCC. This V(4) voltage ensures that TTL output totem-pole top and bottom drivers are in the cut-off mode, thus ensuring that output YA is in the high impedance, tri-stated mode.

In the analysis presented above, a single tri-state control signal—CT—has been used to illustrate the control function performed by the circuit. However, this circuit technique can so be extended to allow multiple input OR / NOR functions, as well as series-gated multiple input AND functions. It is note that the flexibility of control circuit design with universal speed and no power penalty, possible with the present invention, is a significant advantage in system design.

While the invention has been particularly shown and described with reference to a preferred embodiment thereof, it will be understood by those skilled in the art that the foregoing and other changes in form and detail may be made without departing from the spirit and scope of the invention.

I claim:

1. A circuit for translating true ECL input signals, which have a HIGH state and a LOW state, and true ECL tri-state control signals, which have a HIGH state and a LOW state, to true TTL tri-state output signals which have a HIGH state, a LOW state, and a high impedance state, the circuit comprising:
    (a) a translator means for translating said true ECL input signals which have a HIGH state and a LOW state to corresponding true TTL signals which have a HIGH state and a LOW state;
    (b) an output driver means for receiving said true TTL signals which have a HIGH state and a LOW state from said translator means and generating corresponding true TTL tri-state output signals which have a HIGH state and a LOW state, the output driver means comprising:
        (i) a first output transistor capable of generating a true TTL signal with a HIGH state and capable of holding a high impedance state; and
        (ii) a second output transistor coupled to said first output transistor generating a true TT: signal with a LOW state and capable of holding a high impedance state; and
    (c) a tri-state controller means coupled to the output driver means and connected to receive the true ECL tri-state control signals for switching the output driver means into a true TTL tri-state high impedance state based on said true ECL tri-state control signals without converting said true ECL tri-state control signals into TTL tri-state control signals, the tri-state controller means comprising:
        (i) a comparator for comparing a true ECL tri-state control signal with a reference signal and providing a comparison signal if the control signal is in a HIGH state; and
        (ii) a controller electrically coupled to the first output transistor, the second output transistor, and the comparator, for causing the first output transistor to generate a true TTL signal with a HIGH state if the true TTL signal received from the translator is in a HIGH state an the comparator is not providing a comparison signal, for causing the second output transistor to generate a true TTL signal with a LOW state if the true TTL signal received from the translator is in a LOW state and the comparator is not providing a comparison signal, and for causing both the first output transistor and the second output transistor to enter a high impedance state if the comparator is providing a comparison signal.

2. The circuit of claim 1, wherein the controller comprises a transistor.

3. The circuit of claim 1, wherein the first transistor and the second transistor are connected in a totem-pole circuit.

4. A circuit for translating true ECL input signals, which have a HIGH state and a LOW state, and true ECL tri-state control signals, which have a HIGH state and a LOW state, to true TTL tri-state output signals which have a HIGH state, a LOW state, and a high impedance state, the circuit comprising:
    (a) a translator means for translating said true ECL input signals which have a HIGH state and a LOW state to corresponding true TTL signals which have a HIGH state and a LOW state, the translator means comprising:
        (i) a current source;
        (ii) an ECL input comparator coupled to said current source; and
        (iii) a stabilizing feedback means wherein the stabilizing feedback means is coupled to a TTL power source, a TTL ground, and the ECL input comparator, the stabilizing feedback means being comprised of a first NPN transistor, a second NPN transistor, a first resistor, and a second resistor, an emitter of the first transistor being connected to the TTL ground, a collector of the first transistor being connected to a first end of the first resistor and to a base of the second transistor, a base of the first transistor being connected to a first end of the second resistor, an emitter of the second transistor, and the ECL input comparator, a collector of the second transistor, a second end of the first resistor, and a second end of the second resistor being connected to the TTL power source;

(b) an output driver means for receiving said true TTL signals which have a HIGH state and a LOW state from said translator means and outputting corresponding true TTL tri-state output signals which have a HIGH state and a LOW state;

(c) a tri-state controller means coupled to the output driver means and connected to receive the true ECL tri-state control signals for switching the output driver means into a true TTL tri-state high impedance state based on said true ECL tri-state control signals without converting said true ECL tri-state control signals into TTL tri-state control signals.

5. A circuit for translating true ECL input signals, which have a HIGH state and a LOW state, and true ECL tri-state control signals, which have a HIGH state and a LOW state, to true TTL tri-state output signals which have a HIGH state, a LOW state, and a high impedance state, the circuit comprising:

(a) a translator means for translating said true ECL input signals which have a HIGH state and a LOW state to corresponding true TTL signals which have a HIGH state and a LOW state;

(b) an output driver means for receiving said true TTL signals which have a HIGH state and a LOW state from said translator means and outputting corresponding true TTL tri-state output signals which have a HIGH state and a LOW state; and (c) a tri-state controller means coupled to the output driver means and connected to receive the true ECL tri-state control signals for switching the output driver means into a true TTL tri-state high impedance state based on said true ECL tri-state control signals without convection said true ECL tri-state control signals into TTL tri-state control signals, the tri-state controller means being coupled to the translator means, a TTL power source, a TTL ground, and an ECL power source, the tri-state controller means being comprised of a tri-state input comparator connected to the ECL power source and the TTL ground, a first end of a first resistor being connected to a TTL power source, a second end of the first resister being connected to a collector and a base of a first transistor, an emitter of the first transistor being connected to a base of a second transistor and to a collector and a base of a third transistor, a collector of the second transistor being connected to the TTL power source, an emitter of the second transistor being connected to the output driver means, to the tri-state input comparator, and to a collector of a fourth transistor, an emitter of the third transistor being connected to a first end of a schottky diode, a second end of the shcottky diode being connected to the TTL ground, a base of the fourth transistor being connected to the translator means and to a first end of a second resistor, and a second end of the second resistor being connected to the TTL power source.

* * * * *

UNITED STATES PATENT AND TRADEMARK OFFICE
CERTIFICATE OF CORRECTION

PATENT NO.  :  4,857,776
DATED       :  August 15, 1989
INVENTOR(S) :  Aurangzeb K. Khan It is certified that error appears in the above-identified patent and that said Letters Patent is hereby corrected as shown below:

In claim 1, column 8, line 7, of the patent, after "transistor" should appear --capable of--.

In claim 1, column 8, line 7, change "TT:" to --TTL--.

In claim 5, column 10, line 8, change "convection" to --converting--.

Signed and Sealed this

Third Day of April, 1990

Attest:

HARRY F. MANBECK, JR.

*Attesting Officer*  *Commissioner of Patents and Trademarks*